United States Patent [19]
Park et al.

[11] Patent Number: 5,663,100
[45] Date of Patent: Sep. 2, 1997

[54] METHOD FOR FORMING CONTACT HOLES IN SEMICONDUCTOR DEVICE

[75] Inventors: Chan Kwang Park; Yo Hwan Koh; Seong Min Hwang, all of Kyoungki-do, Rep. of Korea

[73] Assignee: Hyundai Electronics Industries Co., Ltd., Rep. of Korea

[21] Appl. No.: 533,543

[22] Filed: Sep. 25, 1995

[30] Foreign Application Priority Data

Sep. 26, 1994 [KR] Rep. of Korea ............... 94-24221

[51] Int. Cl.$^6$ .................................................. H01L 21/44
[52] U.S. Cl. ........................ 438/586; 438/702; 438/947; 438/639
[58] Field of Search ............................. 437/195, 189, 437/190, 228; 157/657.1

[56] References Cited

U.S. PATENT DOCUMENTS

| | | | |
|---|---|---|---|
| 5,087,591 | 2/1992 | Teng | 437/225 |
| 5,279,990 | 1/1994 | Sun et al. | 437/195 |
| 5,294,296 | 3/1994 | Yoon et al. | 156/657.1 |
| 5,444,021 | 8/1995 | Chung et al. | 437/195 |

*Primary Examiner*—John Niebling
*Assistant Examiner*—C. Everhart
*Attorney, Agent, or Firm*—Merchant, Gould, Smith, Edell, Welter & Schmidt

[57] ABSTRACT

A method for forming contact holes in a semiconductor device, involving formation of a ring-shaped pad at a contact region. The ring-shaped pad is used as an etch barrier film upon forming a contact hole. The use of such a ring-shaped pad enables easy formation of a contact hole with a critical dimension. In accordance with this method, it is possible to increase a process margin upon the formation of contact holes for providing contacts with a critical dimension while maintaining an insulation between neighboring conductors.

16 Claims, 7 Drawing Sheets

METHOD FOR FORMING CONTACT HOLES IN SEMICONDUCTOR DEVICE

BACKGROUND OF THE INVENTION

1. Field of the Invention

The present invention relates to a method for forming contact holes in a semiconductor device, and more particularly to a method for forming contact holes having a critical dimension in the fabrication of a highly integrated semiconductor device.

2. Description of the Prior Art

Generally, semiconductor devices have a reduced unit cell area as the integration degree increases. Due to such a reduced unit cell, the space between adjacent conductors is also reduced. The size of contacts adapted to connect lower and upper conductors may also be reduced.

To this end, it is required to provide a technique by which an upper conductor is in contact with a lower conductor such as a silicon substrate while maintaining an insulation from a narrow intermediate conductor.

SUMMARY OF THE INVENTION

Therefore, an object of the invention is to provide a method for forming contact holes in a semiconductor device, capable of making an upper conductor be in contact with a lower conductor while maintaining an insulation from a narrow intermediate conductor.

In accordance with one aspect, the present invention provides a method for forming contact holes in a semiconductor device, comprising the steps of: forming a plurality of uniformly spaced conductors on a semiconductor substrate while insulating the conductors from the semiconductor substrate; depositing a first insulating film over the resulting structure obtained after the formation of the conductors, planarizing the first insulating film, and then depositing a second insulating film and a third insulating film over the first insulating film; forming a first contact mask on a portion of the third insulating film corresponding to a region where a contact hole is to be formed; anisotropically etching portions of the third and second insulating films not covered with the first contact mask, thereby forming patterns of the third and second insulating films, and then isotropically etching the pattern of the second insulating film in a selective manner, thereby forming a narrowed pattern of the second insulating film; removing the first contact mask, and then forming a ring-shaped pad at side walls of the third- and second-insulating film patterns; forming a fourth insulating film over the resulting structure obtained after the formation of the pad, and then forming a second contact mask on the fourth insulating film except for a portion thereof corresponding to the contact hole region; and etching the portion of the fourth insulating film not covered with the second contact mask, removing the third- and second-insulating film patterns, and then anisotropically etching the first insulating film disposed beneath the second-insulating film pattern under a condition that the ring-shaped pad is used as an etch barrier, thereby forming a contact hole with a critical dimension.

In accordance with another aspect, the present invention provides a method for forming contact holes in a semiconductor device, comprising the steps of: forming a plurality of uniformly spaced conductors on a semiconductor substrate while insulating the conductors from the semiconductor substrate; depositing a first insulating film over the resulting structure obtained after the formation of the conductors, planarizing the first insulating film, and then depositing a first etch barrier film, a second insulating film and a third insulating film over the first insulating film in a sequential manner; forming a first contact mask on a portion of the third insulating film corresponding to a region Where a contact hole is to be formed; anisotropically etching portions of the third and second insulating films not covered with the first contact mask, thereby forming patterns Of the third and second insulating films, and then isotropically etching the pattern of the second insulating film in a selective manner, thereby forming a narrowed pattern of the second insulating film; removing the first contact mask, depositing a second etch barrier film over the resulting structure obtained after the removal of the first contact mask, and then anisotropically etching the second etch barrier film, thereby forming a second-etch barrier spacer at side walls of the third- and second-insulating films; removing the third- and second-insulating film patterns, and then anisotropically etching both the second-etch barrier spacer and the first etch barrier film, thereby forming a ring-shaped pad; forming a fourth insulating film over the resulting structure obtained after the formation of the pad, and then forming a second contact mask on the fourth insulating film except for a portion thereof corresponding to the contact hole region; and etching the portion of the fourth insulating film not covered with the second contact mask, and then anisotropically etching the first insulating film disposed beneath the etch portion of the fourth insulating film under a condition that the ring-shaped pad is used as an etch barrier, thereby forming a contact hole with a critical dimension.

In accordance with another aspect, the present invention provides a method for forming contact holes in a semiconductor device, comprising the steps of: forming a plurality of uniformly spaced conductors on a semiconductor substrate while insulating the conductors from the semiconductor substrate; depositing a first insulating film over the resulting structure obtained after the formation of the conductors, planarizing the first insulating film, and then depositing a second insulating film and a third insulating film over the first insulating film; forming a first contact mask on a portion of the third insulating film corresponding to a region where a contact hole is to be formed; etching portions of the third and second insulating films not covered with the first contact mask, thereby forming a recess, and then isotropically etching the second insulating film in a selective manner so that the recess has an increased width; removing the first contact mask, and then forming a ring-shaped pad at a side wall of the recess; forming a fourth insulating film over the resulting structure obtained after the formation of the pad, and then forming a second contact mask on the fourth insulating film except for a portion thereof corresponding to the contact hole region; and etching the portion of the fourth insulating film not covered with the second contact mask, and then anisotropically etching the first insulating film disposed beneath the etch portion of the fourth insulating film under a condition that the ring-shaped pad is used as an etch barrier, thereby forming a contact hole with a critical dimension.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 1 to 5 illustrate sequential steps of a method for forming contact holes in a semiconductor device in accordance with a first embodiment of the present invention, respectively. This embodiment of the present invention is applied to a case wherein bit lines and storage electrodes of dynamic random access memory cells are in contact with a semiconductor substrate.

Figure 1:
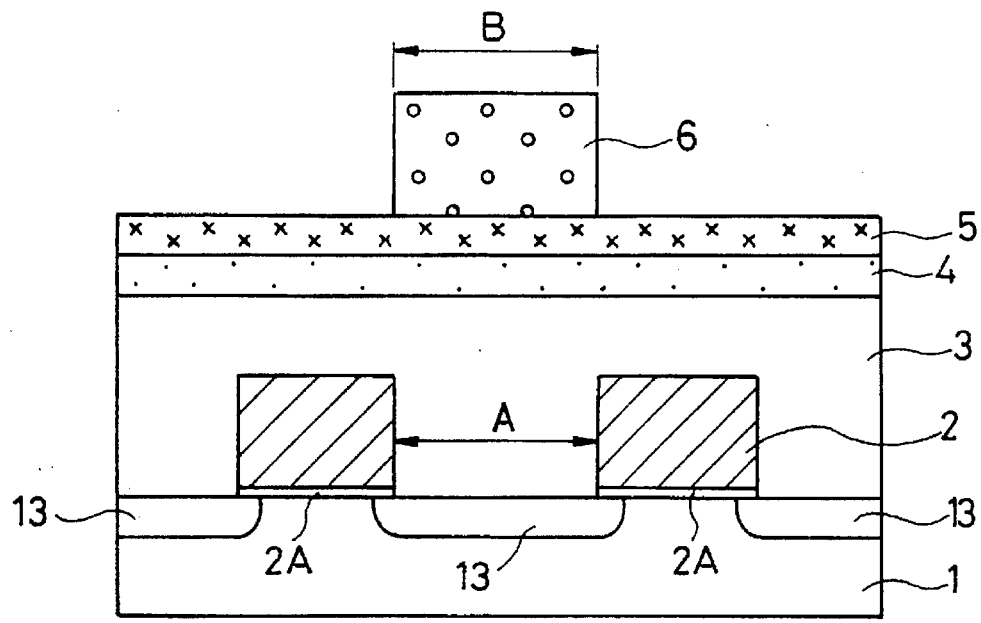
FIGS. 1 to 5 are sectional views respectively illustrating sequential steps of a method for forming contact holes in a semiconductor device in accordance with a first embodiment of the present invention.

Referring to FIG. 1, on a semiconductor substrate 1, a plurality of uniformly spaced gate oxide films 2A is formed. A plurality of uniformly spaced word lines 2 is formed on the gate oxide films 2A. The word lines 2 are made of a polysilicon film and used as gate electrodes. Between adjacent word lines 2, a source or drain junction 13 is formed in the semiconductor substrate 1 by implanting impurity ions of a conduction type different from that of the semiconductor substrate 1. After the formation of source or drain junction 13, a first insulating film 3 is deposited over the resulting structure. The first insulating film 3 is then planarized. Over the planarized first insulating film 3, a second insulating film 4 and a third insulating film 5 are sequentially deposited. The first to third insulating films 3 to 5 are made of materials exhibiting a high etch selection ratio, respectively. A first contact mask 6 is then formed on a portion of the third insulating film 5 corresponding to a region where a contact hole will be formed. In FIG. 1, the reference character A represents the space between adjacent word lines 2 whereas the reference character B represents the dimension of the first contact mask 6. These dimensions may be of a minimum pattern size by use of a lithography technique.

Figure 2:
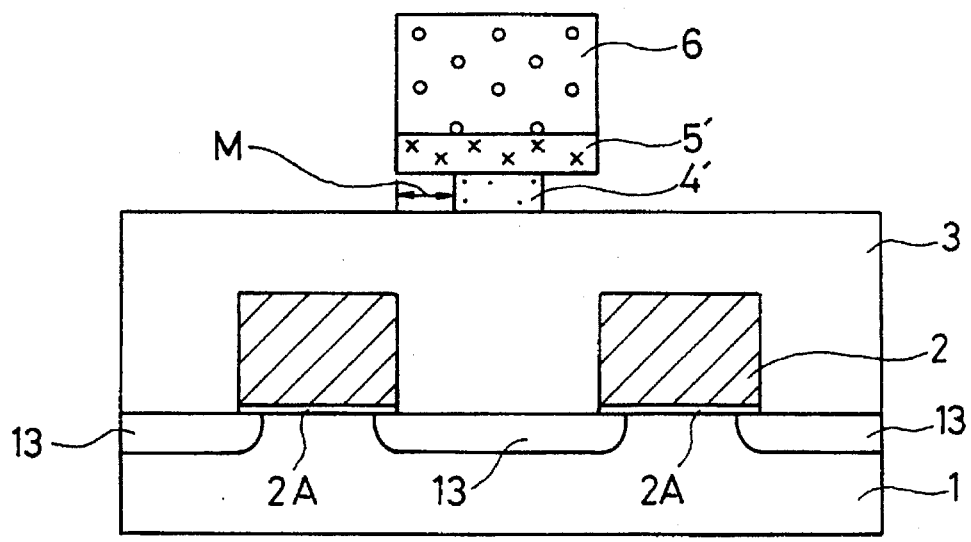

As shown in FIG. 2, portions of the third and second insulating films 5 and 4 not covered with the first contact mask 6 are then anisotropically etched, thereby forming a third-insulating film pattern 5' and a second-insulating film pattern 4'. Subsequently, the second-insulating film pattern 4' is isotropically etched in a selective manner in accordance with the etch rate difference among the first to third insulating films. At this time, the second-insulating film pattern 4' is laterally etched in each side thereof by a width M. As a result, the remaining second-insulating film pattern 4' has a width of B–2M.

Figure 3:
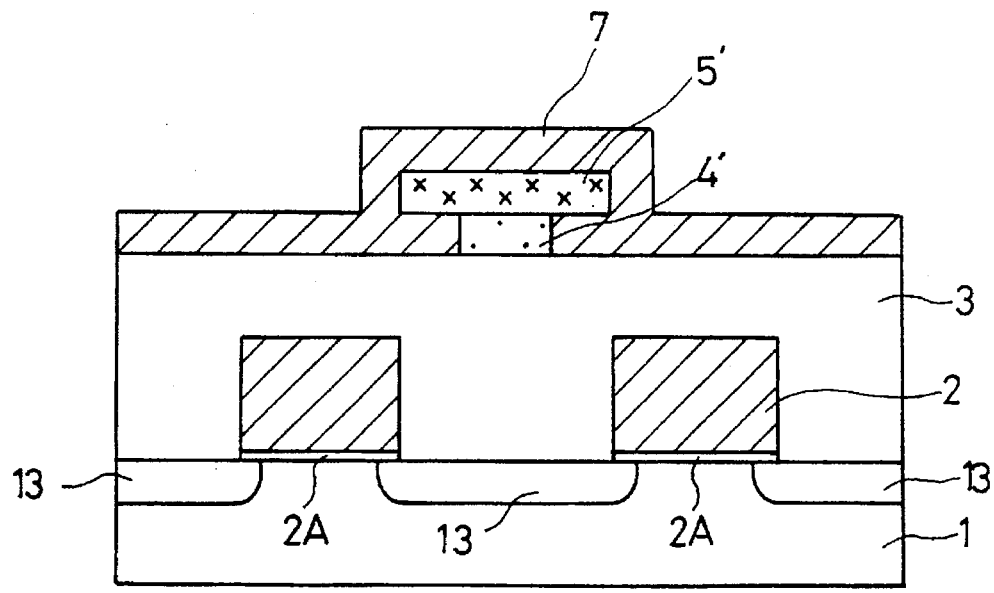

Thereafter, the first contact mask 6 shown in FIG. 2 is removed, as shown in FIG. 3. Over the resulting structure, a polysilicon film 7 is then deposited. In place of the polysilicon film 7, a nitride film may be deposited. The deposition of the polysilicon film 7 is carried out such that it fills recesses respectively defined in both sides of the second-insulating film pattern 4' after the anisotropic etching.

Figure 4:
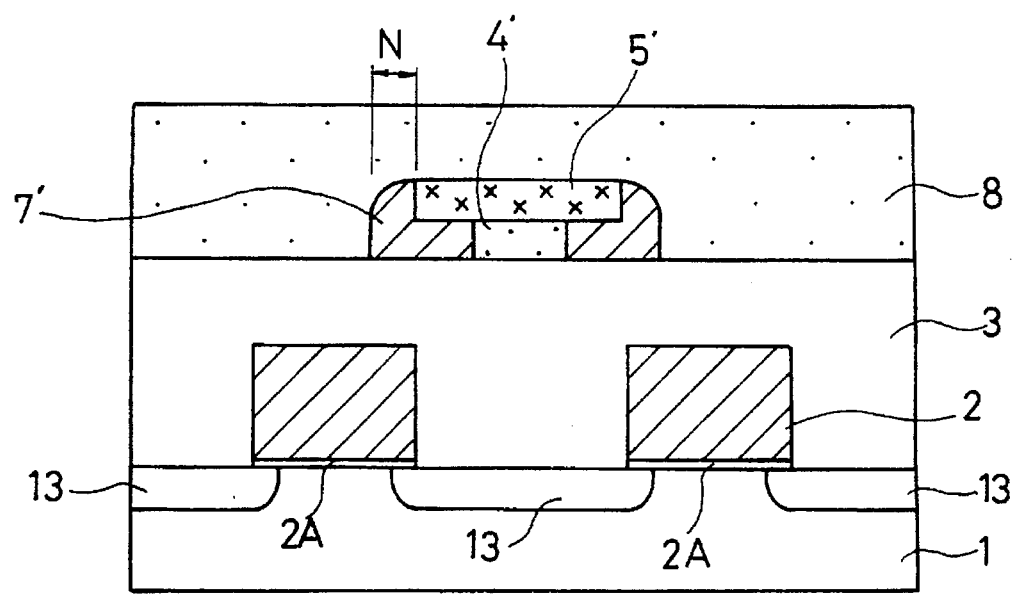

The polysilicon film 7 is then anisotropically etched to form a polysilicon pad 7' which has a ring shape having a protruded edge, as shown in FIG. 4. Over the resulting structure, a fourth insulating film 8 is formed. In FIG. 4, the reference character N represents the protruded width of the polysilicon pad 7'.

Figure 5:
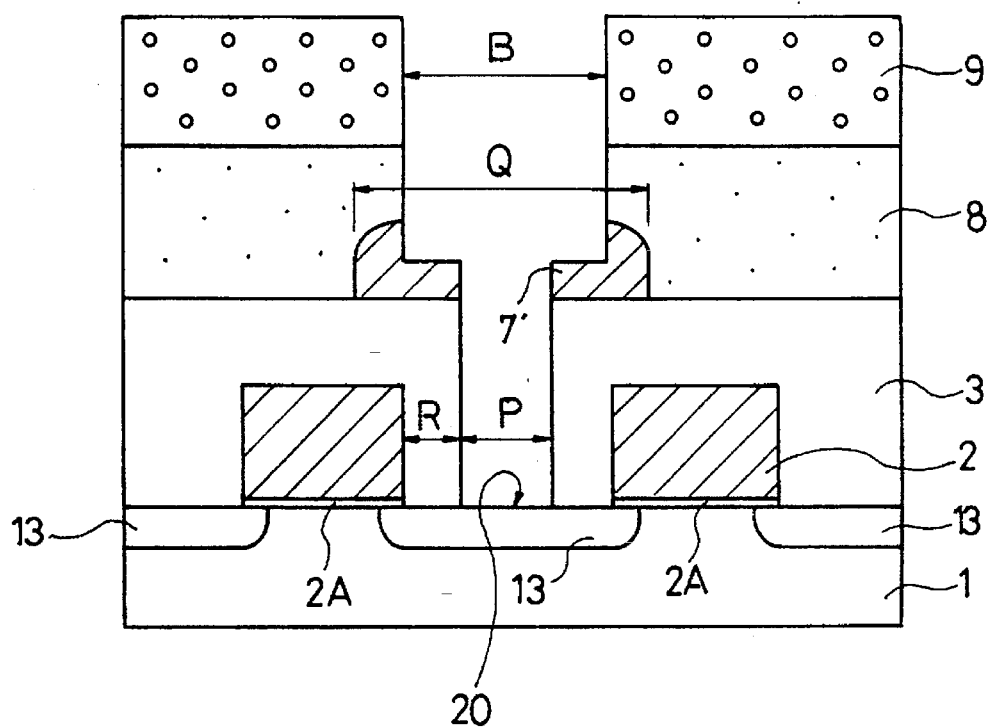

A second contact mask 9 is then formed on the fourth insulating film 8 except for its portion corresponding to the region where the contact hole will be formed, as shown in FIG. 5. Subsequently, portions of the fourth insulating film 8 and third-insulating film pattern 5' not covered with the contact mask 9 are etched, thereby exposing the second insulating film pattern 4'. Using the ring-shaped polysilicon pad 7' as an etch barrier, the second-insulating film pattern 4' and a portion of the first insulating film 3 disposed beneath the second-insulating film pattern 4' are anisotropically etched so that the semiconductor substrate 1 is exposed. As a result, a contact hole 20 is formed. Since the ring-shaped polysilicon pad 7' has an outer diameter Q of B+2N that is larger than the dimension B of the first contact mask by 2N, the inner diameter P of the contact hole 20 corresponds to "B–2M".

Accordingly, a process margin R of (A–B+2M)/2 is provided between the contact hole 20 and each word line 2. Even for the second contact mask 9, an alignment margin can be obtained which corresponds to the protruded width N of the polysilicon pad 7'.

After the formation of contact hole 20, the second contact mask 9 is removed. Over the resulting structure, an upper conduction layer is deposited such that it comes into contact with the drain or source junction 13 exposed through the contact hole 20.

FIGS. 6 to 10 are sectional views respectively illustrating sequential steps of a method for forming contact holes using a ring-shaped polysilicon pad in accordance with a second embodiment of the present invention. In FIGS. 6 to 10, elements respectively corresponding to those in FIGS. 1 to 5 are denoted by the same reference numerals.

Figure 6:
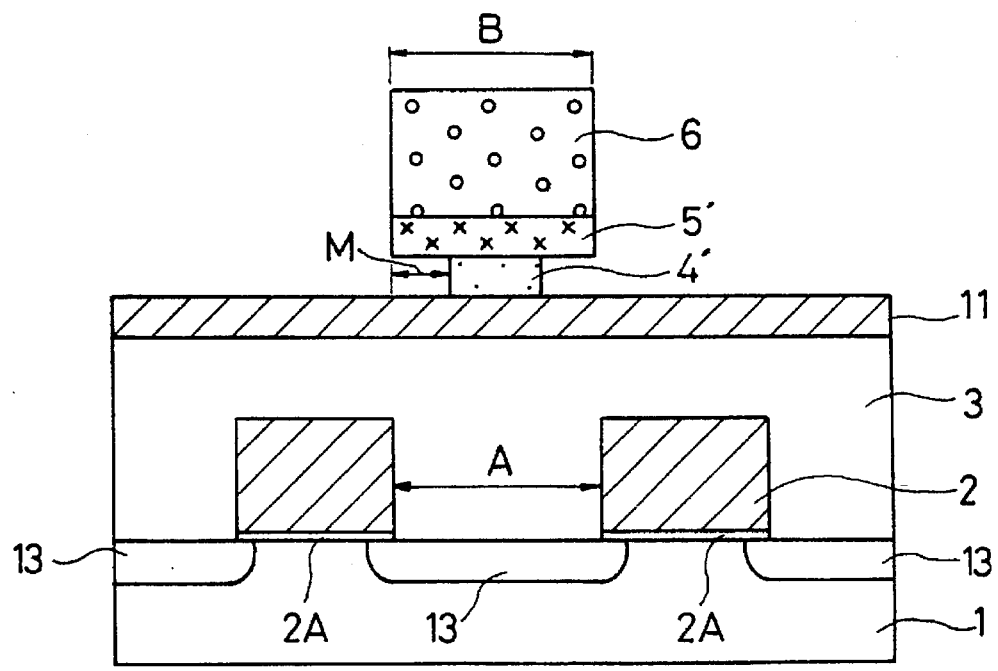
FIGS. 6 to 10 are sectional views respectively illustrating sequential steps of a method for forming contact holes using a ring-shaped polysilicon pad in accordance with a second embodiment of the present invention.

On a semiconductor substrate 1, a plurality of uniformly spaced gate oxide films 2A are formed as shown in FIG. 6. A plurality of uniformly spaced word lines 2 are then formed on the gate oxide films 2A, respectively. The word lines 2 are made of a polysilicon film and used as gate electrodes. Impurity ions of a conduction type different from that of the semiconductor substrate 1 are implanted in a portion of the semiconductor substrate 1 defined between adjacent word lines 2, thereby forming a source or drain junction 13. Over the resulting structure, a first insulating film 3 is deposited and then planarized. A first polysilicon film 11 to be used as an etch barrier is then formed over the resulting structure. Thereafter, a second insulating film 4 and a third insulating film 5 are sequentially deposited over the first polysilicon film 11. The first to third insulating films 3 to 5 are each made of materials exhibiting a high etch selection ratio. A first contact mask 6 is then formed on a portion of the third insulating film 5 corresponding to a region where a contact hole will be formed. Portions of the third and second insulating films 5 and 4 not covered with the first contact mask 6 are then etched, thereby forming a third-insulating film pattern 5' and a second-insulating film pattern 4'. Subsequently, the second-insulating film pattern 4' is isotropically etched in a selective manner in accordance with the etch rate difference among the first to third insulating films. In FIG. 6, the reference character A represents the space between adjacent word lines 2 whereas the reference character B represents the dimension of the first contact mask 6. After the isotropic etching, the second-insulating film pattern 4' has a width of B–2M.

Figure 7:
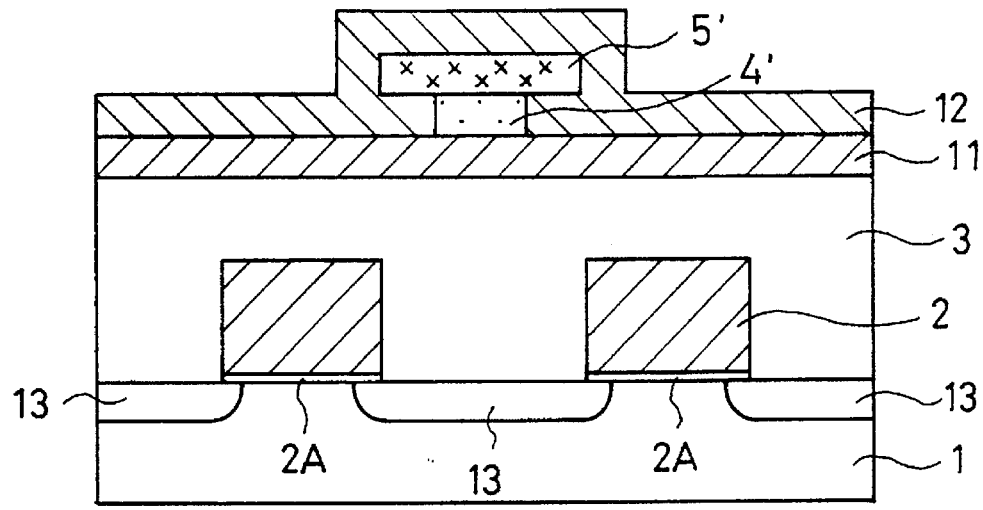

The first contact mask 6 is then removed, as shown in FIG. 7. Thereafter, a second polysilicon film 12 to be used as an etch barrier is deposited over the resulting structure. In place of the polysilicon film 12, a nitride film may be deposited.

Figure 8:
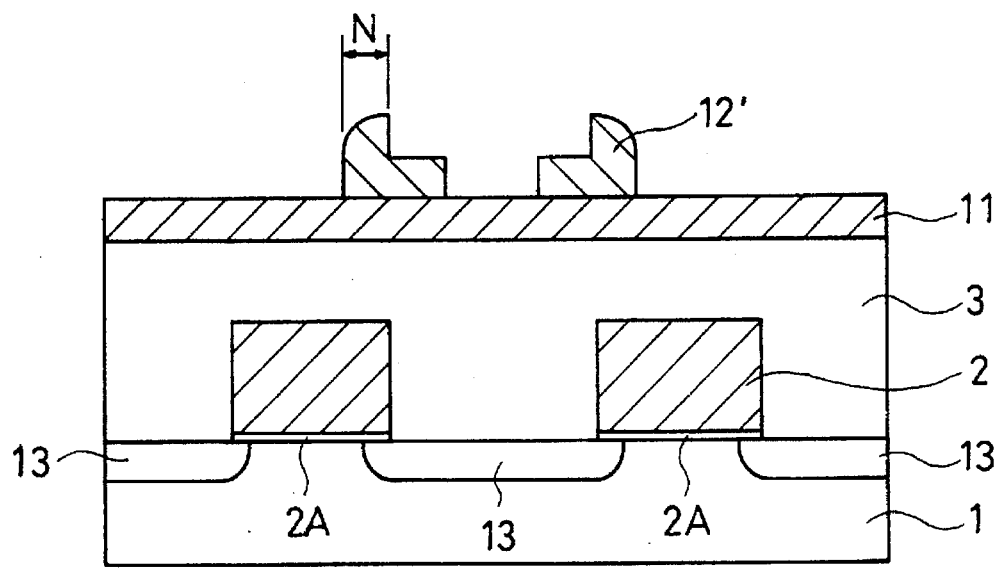
Figure 9:
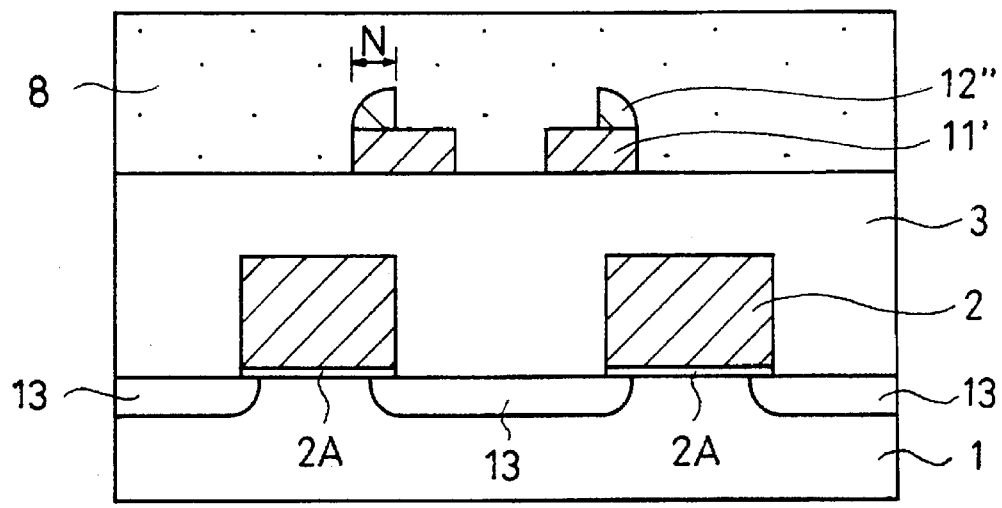

The second polysilicon film 12 is then anisotropically etched to form second-polysilicon film spacers 12', as shown in FIG. 8. Using the first polysilicon film 11 as an etch barrier, both the second-insulating film pattern 4' and the third-insulating film pattern 5' are then etched. The second polysilicon spacer 12' has a width of N.

Thereafter, the second polysilicon spacer 12' and the first polysilicon film 11 are anisotropically etched by a depth corresponding to the thickness of the first polysilicon film 11 in a fashion that a polysilicon pad having a ring shape with a protrusion is formed. In this case, the polysilicon pad includes a first-polysilicon film pad 11' constituting the base of polysilicon pad and a second-polysilicon film pad 12" constituting the protrusion of the polysilicon pad. Over the resulting structure, a fourth insulating film 8 is then formed.

Figure 10:
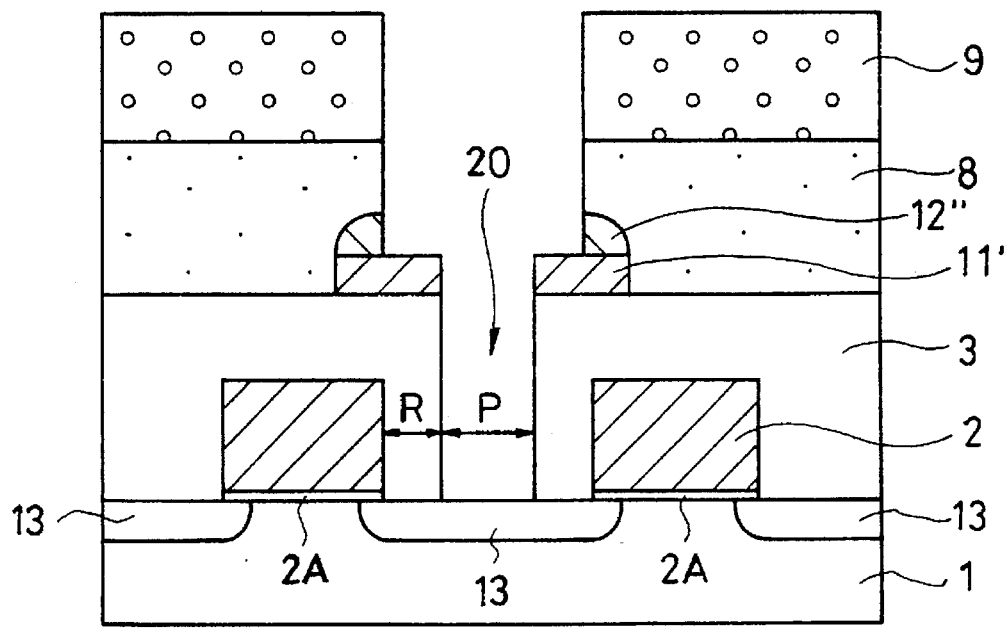

Subsequently, a second contact mask 9 is formed on the fourth insulating film 8 except for its portion corresponding to the region where the contact hole will be formed, as shown in FIG. 10. The portion of the fourth insulating film 8 not covered with the second contact mask 9 is etched. Using the ring-shaped polysilicon pads 11' and 12" as an etch barrier, the first insulating film 3 is etched so that the source or drain junction 13 of semiconductor substrate 1 is exposed. As a result, a contact hole 20 is formed. The inner diameter P of the contact hole 20 corresponds to "B−2M". Accordingly, a process margin R of (A−B+2M)/2 is provided between the contact hole 20 and each word line 2. Upon forming the second contact mask 9, an alignment margin can be obtained which corresponds to the protruded width N of the polysilicon pad.

Figure 11:
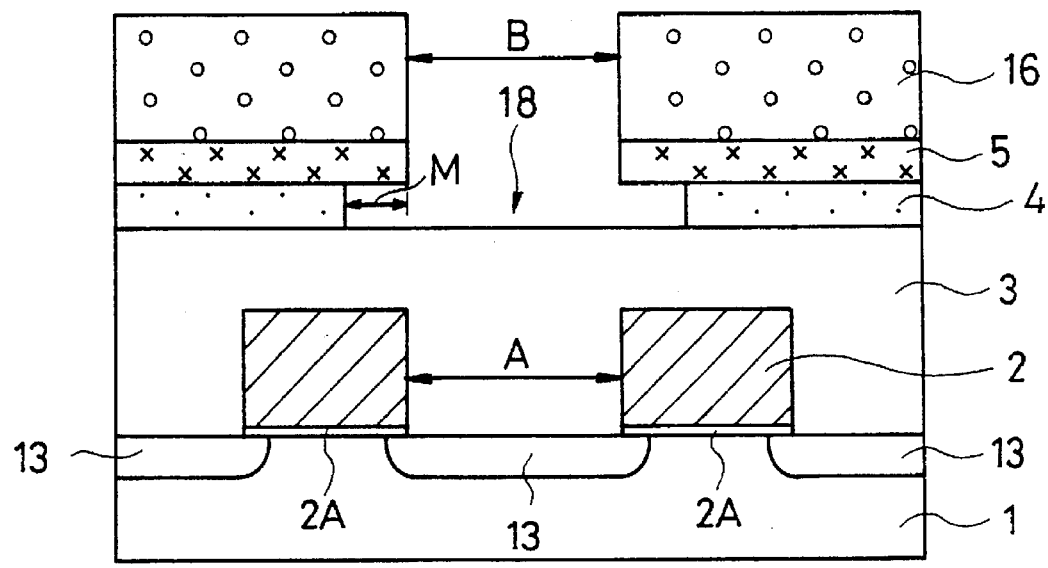
FIGS. 11 to 13 are sectional views respectively illustrating sequential steps of a method for forming contact holes using a ring-shaped polysilicon pad in accordance with a third embodiment of the present invention.
Figure 12:
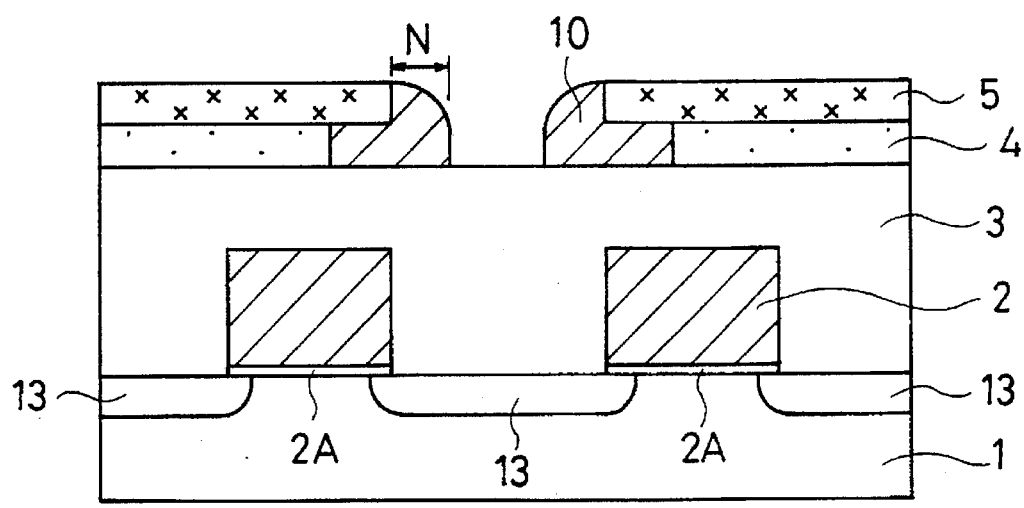
Figure 13:
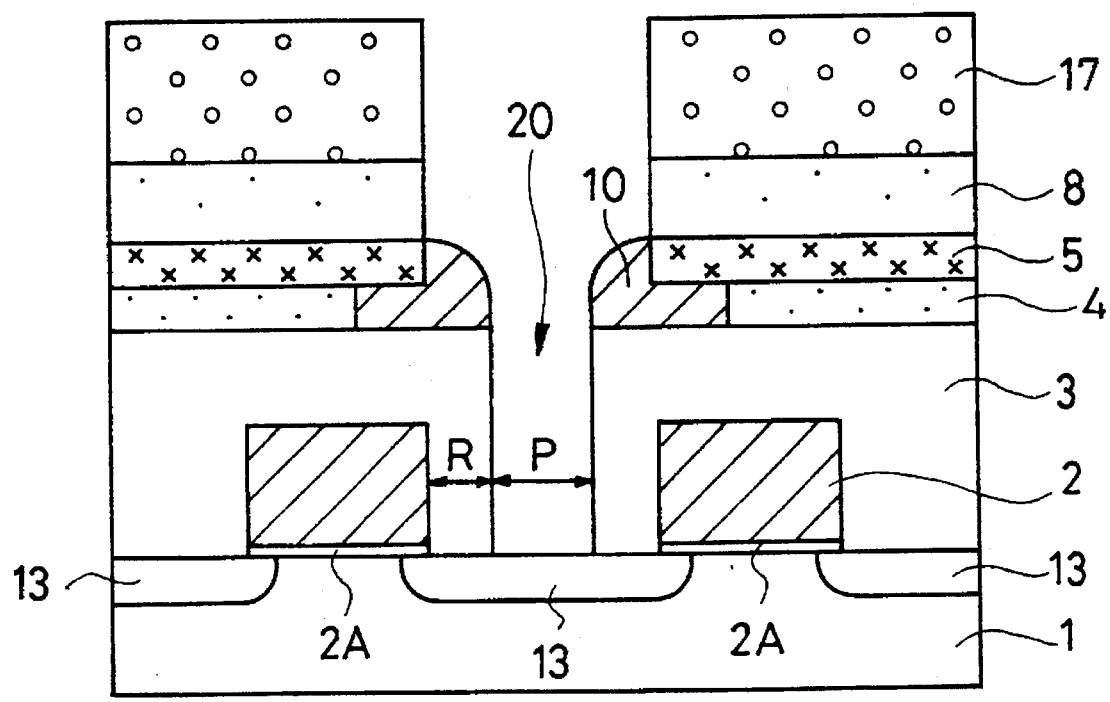

FIGS. 11 to 13 are sectional views respectively illustrating sequential steps of a method for forming contact holes using a ring-shaped polysilicon pad in accordance with a third embodiment of the present invention. In FIGS. 11 to 13, elements corresponding to those in FIGS. 1 to 5 are denoted by the same reference numerals.

In accordance with the method of the third embodiment, a plurality of uniformly spaced gate oxide films 2A are formed on a semiconductor substrate 1, as shown in FIG. 11. A plurality of uniformly spaced word lines 2 are then formed on the gate oxide films 2A, respectively. The word lines 2 are made of a polysilicon film and used as gate electrodes. Impurity ions of a conduction type different from that of the semiconductor substrate 1 are implanted in a portion of the semiconductor substrate 1 defined between adjacent word lines 2, thereby forming a source or drain junction 13. Over the resulting structure, a first insulating film 3 is deposited and then planarized. Thereafter, a second insulating film 4 and a third insulating film 5 are sequentially deposited over the first insulating film 3. The first to third insulating films 3 to 5 are each made of materials exhibiting a high etch selection ratio. A first contact mask 16 is then formed on a portion of the third insulating film 5 corresponding to a region where a contact hole will be formed. Portions of the third and second insulating films 5 and 4 not covered with the first contact mask 16 are then etched, thereby forming a recess 18. Subsequently, the second insulating film 4 is isotropically etched in a selective manner such that it has an etched width of M in each side thereof. In FIG. 11, the reference character A represents the space between adjacent word lines 2 whereas the reference character B represents the dimension of the portion not covered with the first contact mask 16. These dimensions may be of a minimum pattern size by use of a lithography technique.

Thereafter, the first contact mask 16 is removed as shown in FIG. 12. Over the resulting structure, a first polysilicon film is then deposited. In place of this polysilicon film, a nitride film may be deposited. The first polysilicon film is then anisotropically etched to form a ring-shaped polysilicon pad 10 at the side wall of the recess 18. The polysilicon pad 10 has a protrusion with a width of N. The polysilicon pad 10 also has an outer diameter of B+2M and an inner diameter of B−2N.

Referring to FIG. 13, over the resulting structure, a fourth insulating film 8 is then formed. Thereafter, a second contact mask 17 is formed on the fourth insulating film 8 except for its portion corresponding to the region where the contact hole will be formed. Using the ring-shaped polysilicon pad 10 as an etch barrier, the first insulating film 3 is then etched so that the source or drain junction 13 of semiconductor substrate 1 is exposed. As a result, a contact hole 20 is formed. The size P of the contact hole 20 corresponds to "B−2N". Accordingly, a process margin R of (A−B+2M)/2 is provided between the contact hole 20 and each word line 2. Upon forming the second contact mask, an alignment margin can be obtained which corresponds to the protruded width N of the polysilicon pad.

As apparent from the above description, the present invention provides a method for forming contact holes with a critical dimension, capable of obtaining an increased process margin and yet maintaining an insulation between neighboring conductors.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming contact holes in a semiconductor device, comprising the steps of:

forming a plurality of uniformly spaced conductors on a semiconductor substrate while insulating the conductors from the semiconductor substrate;

depositing a first insulating film over the resulting structure obtained after the formation of the conductors, planarizing the first insulating film, and then depositing a second insulating film and a third insulating film over the first insulating film;

forming a first contact mask on a portion of the third insulating film corresponding to a region where a contact hole is to be formed;

anisotropically etching portions of the third and second insulating films not covered with the first contact mask, thereby forming patterns of the third and second insulating films, and then isotropically etching the pattern of the second insulating film in a selective manner, thereby forming a narrowed pattern of the second insulating film;

removing the first contact mask, and then forming a ring-shaped pad at side walls of the third- and second-insulating film patterns;

forming a fourth insulating film over the resulting structure obtained after the formation of the pad, and then forming a second contact mask on the fourth insulating film except for a portion thereof corresponding to the contact hole region; and etching the portion of the fourth insulating film not covered with the second contact mask, removing the third- and second-insulating film patterns, and then anisotropically etching the first insulating film disposed beneath the second-insulating film pattern under a condition that the ring-Shaped pad is used as an etch barrier, thereby forming a contact hole with a critical dimension.

2. The method in accordance with claim 1, wherein the conductors formed on the semiconductor substrate are adapted to be used as word lines.

3. The method in accordance with claim 1, wherein the step of forming the ring-shaped pad comprises the steps of:

forming an etch barrier film over the resulting structure obtained after the formation of the second-insulating film pattern; and anisotropically etching the etch barrier film.

4. The method in accordance with claim 3, wherein the etch barrier film is comprised of a polysilicon film or a nitride film.

5. The method in accordance with claim 1, wherein the semiconductor substrate is formed with a drain or source junction at a portion thereof not covered with the conductors.

6. The method in accordance with claim 1, wherein the first to third insulating films are made of materials exhibiting a high etch selection ratio, relative to each other.

7. A method for forming contact holes in a semiconductor device, comprising the steps of:

forming a plurality of uniformly spaced conductors on a semiconductor substrate while insulating the conductors from the semiconductor substrate;

depositing a first insulating film over the resulting structure obtained after the formation of the conductors, planarizing the first insulating film, and then depositing a first etch barrier film, a second insulating film and a third insulating film over the first insulating film in a sequential manner;

forming a first contact mask on a portion of the third insulating film corresponding to a region where a contact hole is to be formed;

anisotropically etching portions of the third and second insulating films not covered with the first contact mask, thereby forming patterns of the third and second insulating films, and then isotropically etching the pattern of the second insulating film in a selective manner, thereby forming a narrowed pattern of the second insulating film;

removing the first contact mask, depositing a second etch barrier film over the resulting structure obtained after the removal of the first contact mask, and then anisotropically etching the second etch barrier film, thereby forming a second-etch barrier spacer at side walls of the third and second insulating films;

removing the third and second insulating film patterns, and then anisotropically etching both the second etch barrier spacer and the first etch barrier film, thereby forming a ring-shaped pad;

forming a fourth insulating film over the resulting structure obtained after the formation of the pad, and then forming a covered portion of the fourth insulating film with a second contact mask on the fourth insulating film except for an uncovered portion thereof corresponding to the contact hole region; and etching the uncovered portion of the fourth insulating film not covered with the second contact mask, and then anisotropically etching the first insulating film disposed beneath the etched uncovered portion of the fourth insulating film under a condition that the ring-shaped pad is used as an etch barrier, thereby forming a contact hole with a critical dimension.

8. The method in accordance with claim 7, wherein the conductors formed on the semiconductor substrate are adapted to be used as word lines.

9. The method in accordance with claim 7, wherein the ring-shaped pad is formed by anisotropically etching both the second etch barrier spacer and the first etch barrier film by a depth corresponding to the thickness of the first etch barrier film.

10. The method in accordance with claim 7, wherein the first and second etch barrier films are comprised of a polysilicon film or a nitride film.

11. The method in accordance with claim 7, wherein the first to third insulating films are made of materials exhibiting a high etch selection ratio, relative to each other.

12. A method for forming contact holes in a semiconductor device, comprising the steps of:

forming a plurality of uniformly spaced conductors on a semiconductor substrate while insulating the conductors form the semiconductor substrate;

depositing a first insulating film over the resulting structure obtained after the formation of the conductors, planarizing the first insulating film, and then depositing a second insulating film and a third insulating film over the first insulating film;

forming a first contact mask on a portion of the third insulating film corresponding to a region where a contact hole is to be formed;

etching portions of the third and second insulating films not covered with the first contact mask, thereby forming a recess, and then isotropically etching the second insulating film in a selective manner so that the recess has an increased width;

removing the first contact mask, and then forming a ring-shaped pad at a side wall of the recess;

forming a fourth insulating film over the resulting structure obtained after the formation of the pad, and then forming a covered portion of the fourth insulating film with a second contact mask on the fourth insulating film except for an uncovered portion thereof corresponding to the contact hole region; and etching the uncovered portion of the fourth insulating film not covered with the second contact mask, and then anisotropically etching the first insulating film disposed beneath the etched uncovered portion of the fourth insulating film under a condition that the ring-shaped pad is used as an etch barrier, thereby forming a contact hole with a critical dimension.

13. The method in accordance with claim 12, wherein the conductors formed on the semiconductor substrate are adapted to be used as word lines.

14. The method in accordance with claim 12, wherein the step of forming the ring-shaped pad comprises the steps of:

depositing a pad film over the resulting structure obtained after the removal of the first contact mask; and anisotropically etching the pad film such that the pad is formed at the side wall of the recess.

15. The method in accordance with claim 12, wherein the etch ring-shaped pad film is comprised of a polysilicon film or a nitride film.

16. The method in accordance with claim 12, wherein the first to third insulating films are made of materials exhibiting a high etch selection ratio, relative to each other.

* * * * *